United States Patent [19]
Ikuzaki et al.

[11] 4,085,458
[45] Apr. 18, 1978

[54] RANDOM ACCESS MEMORY

[75] Inventors: Kunihiko Ikuzaki, Hinodemachi; Tsuneo Ito, Kodaira; Masamichi Ishihara, Tachikawa; Takashi Sato, Kodaira, all of Japan

[73] Assignee: Hitachi, Ltd., Japan

[21] Appl. No.: 690,303

[22] Filed: May 26, 1976

[30] Foreign Application Priority Data

Jun. 4, 1975 Japan ................................. 50-66552

[51] Int. Cl.² ............................................... G11C 7/02
[52] U.S. Cl. .................................... 365/206; 307/238; 365/203
[58] Field of Search .................... 340/173 R, 173 CA; 307/238, DIG. 5

[56] References Cited

U.S. PATENT DOCUMENTS 3,980,899  9/1976  Shimada et al. ................. 340/173 R Primary Examiner—Stuart N. Hecker
Attorney, Agent, or Firm—Craig & Antonelli

[57] ABSTRACT

In a n-channel (or p-channel) random access memory in which a plurality of memory cells are arranged in a matrix form in a p-type (or n-type) semiconductor substrate, clamping MOSFET's are connected between word lines provided for the associated rows of memory cells of the matrix and a reference potential to which gates the source electrodes of the information storing MOSFET's of the memory cells are connected. The clamping MOSFET has a lower threshold voltage than a row selecting MOSFET connected to the word line and clamps the word line when the word line is not selected, so that a delay in the read-out operation is eliminated or suppressed.

2 Claims, 6 Drawing Figures

RANDOM ACCESS MEMORY

The invention relates to a random access memory (hereinafter referred to as RAM) constructed in a form of MIS integrated circuit.

An object of the invention is to eliminate or suppress a delay in the read-out operation of such a RAM integrated circuit.

According to the invention, there is provided a n-channel (or p-channel) random access memory comprising in a p-type (or n-type) semiconductor substrate: a plurality of memory cells arranged in a matrix form, each of the memory cells including an information storing MOSFET having a source electrode connected to a reference potential, the semiconductor substrate being connected to receive a negative (or positive) bias potential relative to the reference potential, word lines being associated with respective rows of the matrix, the word line being connected to receive a positive (or negative) voltage signal relative to the reference potential; row selecting MOSFET's connected to the word lines respectively; and clamping MOSFET's connected between the word lines and the reference potential respectively, said clamping MOSFET having a lower threshold voltage than that of the row selecting MOSFET to thereby clamp the word line when the word line is not selected.

The invention will be described in conjunction with the accompanying drawings, in which.

In general, a MOSRAM is so arranged that, upon reading from a memory matrix, one desired column of the memory matrix is selected to simultaneously read out all the bit signals stored in all the rows of the matrix associated with the selected column. Subsequently, only one bit signal is derived as a data signal by means of a Y-selector switch. Such a general configuration of a MOSRAM is described, for example, in a publication entitled "MOS-LSI's and Applications", pp. 80 - 81, published by Sanpoh Co. Ltd., in Japan.

Figure 1:
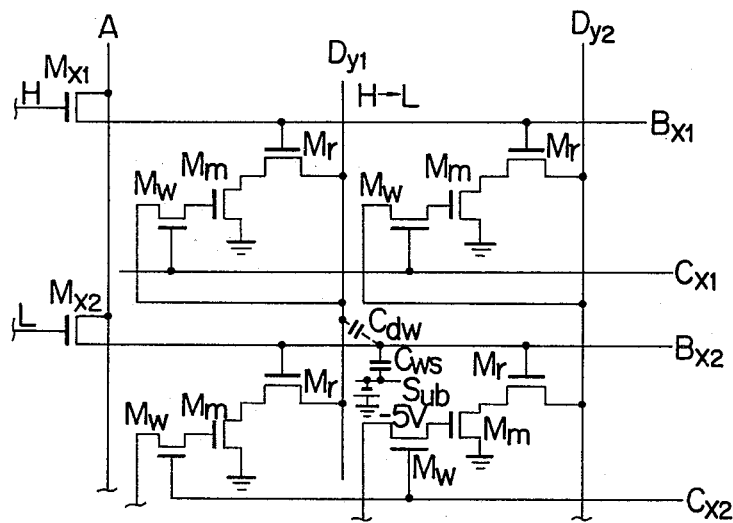
FIG. 1 is a circuit diagram showing a hitherto known MOSRAM.

An example of a hitherto known MOSRAM circuit of a matrix configuration is shown in FIG. 1.

This memory circuit is constructed in a form of a n-channel MOS integrated circuit which is superior to a p-channel MOS integrated circuit insofar as the speed of circuit operation is concerned. Since the n-channel MOSFET manufactured according to a conventional MOS device manufacturing process will operate in a depletion mode, the n-channel MOS integrated circuit has to be connected to a backward bias voltage at the semiconductor substrate in order to operate the circuit in an enhancement mode. To this end, the semiconductor substrate is connected to a negative potential of $-5$ volts, for example, while the source electrodes of the information storing MOSFET's $M_m$ are set at zero or ground potential. A positive voltage signal is used for the selection signal and the output signal. The read-out operation is effected by feeding a positive voltage to data line $D_y$ ($D_{y1}$, $D_{y2}$, . . .) through a load in such a manner that a high level potential at the input of a storing MOSFET $M_m$ corresponding to a selected bit will lower the potential of the associated data line to a low level through the above storing MOSFET $M_m$. The read-out selection is performed by feeding a read-out signal to a word line $B_x$ ($B_{x1}$, $B_{x2}$, $B_{x3}$, . . .) through a word driving MOSFET $M_x$ ($M_{x1}$, $M_{x2}$, . . .) driven by the output from a decoder (not shown). Each of the word lines is in a floating state when it is not selected.

In connection with the read-out operation described above, it is known that the data line $D_{y1}$ is set to a potential determined by the ratio of stray capacitances $C_{dw}$ and $C_{ws}$ existing respectively between the data line $D_{y1}$ and the non-selected word line $B_{x2}$, for example, and between the word line $B_{x2}$ and the substrate, when the data line $D_{y1}$ is switched to the low potential level, since the data lines $D_y$, non-selected word line $B_{x2}$ and the substrate are coupled in a.c. manner to one another through the above stray capacitances. This may result in a negative potential at the non-selected word line $B_{x2}$ with the absolute value of the potential exceeding the threshold voltage $V_{th}$ of the word driving MOSFET $M_{x2}$. In such a case, the MOSFET $M_{x2}$ will be turned on due to the potential difference across the source and the gate, thereof, which is greater than the threshold voltage $V_{th}$.

In this manner, the load capacitance for the read-out signal is increased remarkably due to the stray capacitances of the non-selected word lines added transiently to the line stray capacitance of the selected word line. Consequently, it takes a lot of time for charging the load capacitance for the read-out operation, which in turn is subjected to a corresponding delay.

The invention is intended to eliminate or reduce such delay. Now, the invention will be described in conjunction with preferred embodiments thereof.

Figure 2:
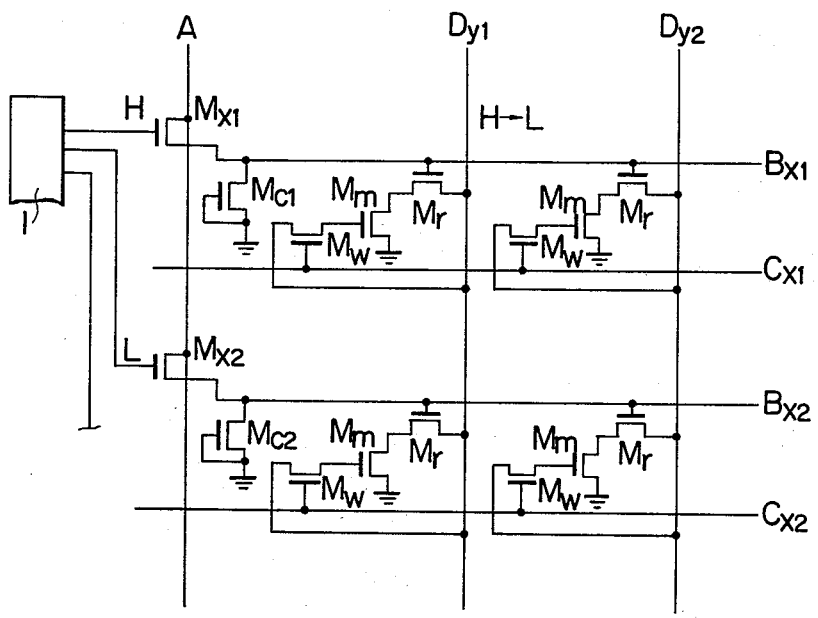
FIG. 2 is a circuit diagram showing an embodiment of the MOSRAM according to the invention.
Figure 3A:
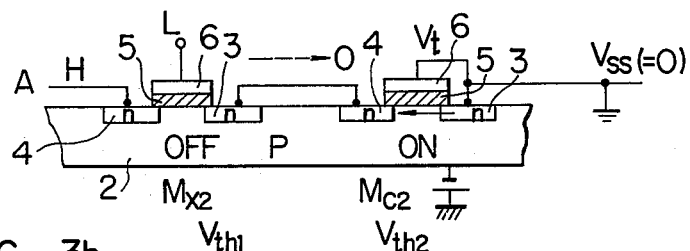
FIGS. 3a and 3b show in sectional views a row selecting MOSFET and a clamping MOSFET in non-selecting time and selecting time, respectively.

FIG. 2 shows a MOSRAM circuit constructed in a form of a n-channel MOS integrated circuit according to an embodiment of the invention. In this embodiment, a p-type semiconductor substrate is connected to a negative bias voltage of $-5$ volts, for example, as seen in FIG. 3a, with a positive signal being used for the selecting signal and the output signal. The sources of the information storing MOSFET's are maintained at a reference or ground potential. In an alternative embodiment comprising a p-channel MOS integrated circuit in which a n-type semiconductor substrate is employed, a negative voltage is used for both of the selecting signal and the output signal with the substrate being positively biased.

In FIG. 2, reference symbols $M_{x1}$, $M_{x2}$, . . . $M_{xn}$ denote row selecting MOSFET's driven by the output from a decoder 1, $M_w$ denotes MOSFET's each constituting a writing and refreshing gate, $M_r$ denotes MOSFET's for read-out gates, $M_m$ denotes information storing MOSFET's and $M_{c1}$, $M_{c2}$, . . . $M_{cn}$ denotes clamping MOSFET's connected between the associated word lines $B_{x1}$, $B_{x2}$, . . . $B_{xn}$ and the reference potential. The gate of the clamping MOSFET is also connected to the reference potential. It is to be noted that the clamping MOSFET $M_c$ has a threshold value lower than those of the other MOSFET's and in particular that of the row selecting MOSFET $M_x$. Reference symbol A denotes read-out lines and $D_{y1}$, $D_{y2}$, ... $D_{yn}$ denote data lines which are destined to be used for the transmission of both the writing data and the read-out data. Symbols $C_{x1}$, $C_{x2}$, ... $C_{xn}$ denote lines for a writing signal.

The writing, refreshing and read-out operations of the memory circuit of the above-described construction are performed in a similar manner as a well known dynamic MOSRAM, for the detail of which reference should be made to the hereinbefore cited publication "MOS-LST's and Applications", pp. 81 – 82.

A characteristic feature of the MOSRAM circuit according to the invention described above resides in the provision of the clamping MOSFET $M_c$ having a low threshold voltage connected between the respective word lines $B_x$ and the reference potential and having the gate connected also to the reference potential.

By virtue of the above arrangement, when non-selected word line $B_{x2}$ tends to take a negative potential of a greater absolute value than the threshold of the FET $M_{x1}$ for the selected word line $B_{x1}$ upon the transition of the potential of the data line $D_{y1}$ to a low level as described hereinbefore, the clamping MOSFET $M_{c2}$ having a lower threshold than that of the row selecting MOSFET $M_{x2}$ will be turned on earlier, whereby the non-selected word lines are immediately set to the negative potential, the absolute value of which is equal to the threshold voltage $V_{th2}$ of the MOSFET $M_{c2}$, as indicated in FIG. 3a. Thus, the potential difference across the source and drain of the row selecting MOSFET will remain lower than the threshold voltage $V_{th1}$. In this manner, the possibility of the non-selected row selecting MOSFET's being turned on is positively excluded. Further, since the load capacitance for the read-out signal is constituted only by the capacitance at the selected line, the read-out operation is not subjected to a delay.

Figure 4:
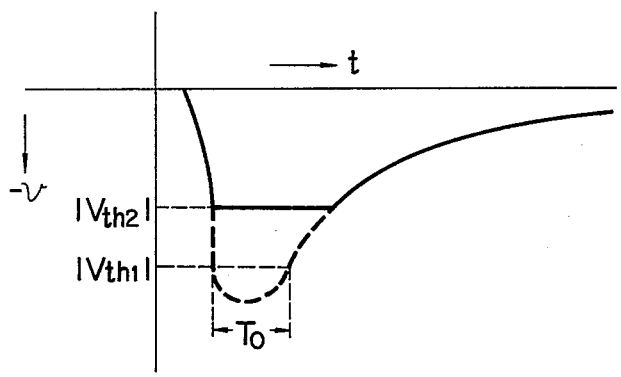
FIG. 4 illustrates graphically variations of potential at a word line as a function of time as caused by potential level drop of a data line, in which a solid line represents such variation in the case of a MOSRAM according to the invention, and a broken line represents that a hitherto known RAM.

FIG. 4 graphically illustrates variation in the potential at the non-selected line as a function of time, wherein the solid curve represents such variation in the MOSRAM circuit according to the invention and the broken curve represents the corresponding variation in a conventional MOSRAM circuit. As can be clearly seen from the figure, the potential at the non-selected line is not allowed to become greater than the absolute value of $V_{th2}$ due to the clamping operation of the MOSFET's $M_c$ according to the invention, whereby the row selecting MOSFET's is prevented from being turned on during the time span $T_o$ in which the row selecting MOSFET of the hitherto known memory circuit tends to be turned on.

Figure 3B:
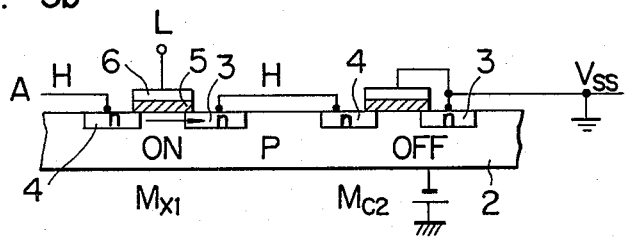

As is indicated in FIG. 3b, the potential difference produced across the source-gate path of the clamping MOSFET's $M_c$ of the selected row will cause these MOSFET's to be turned off without involving adverse interference with the read-out operation. Thus, read-out signal can be obtained without any attenuation.

As a means for making the threshold voltage of the clamping MOSFET lower than those of the other MOSFET's, one of the most convenient method will be to control the threshold value through ion implantation techniques. Alternatively, the threshold value of the clamping MOSFET may be decreased by making the channel thereof shorter. The latter method is also well known as is described in "Collection of Lectures", pp. 156 – 159 at the International Electron Device Meeting held November 1973.

Figure 5:
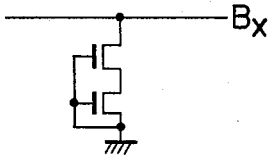
FIG. 5 is a circuit diagram showing another embodiment of the invention.

When the threshold value of the clamping MOSFET is lowered as compared with that of the other MOSFET's by employing he shortened channel as described above, there may arise such a case that the break-down voltage of the clamping MOSFET should become lower than the read-out signal voltage applied across the source-drain path of the MOSFET upon the selecting operation. With a view to eliminating the above undesirable phenomenon, it is preferred in such case to provide a pair of MOSFET's in a series connection as shown in FIG. 5 thereby to decrease the voltage across the single FET by division. Of course, three or more MOSFET's may be provided in series connection, as occasion requires.

In the above-described embodiments, it has been assumed that the MOSRAM circuit has the gate insulation film made of an oxide. However, it is obvious that the invention is never restricted to these embodiments, but can be widely applied to MISRAM such as the one using silicon nitride insulation film for the gate. The invention can be widely applied to RAM's constructed in a form of the MIS integrated circuit adapted to be used with the semiconductor substrate being backwardly biased, regardless of whether the integrated circuit is of n-channel or p-channel MIS type.

As will be appreciated from the foregoing description, it is possible to reduce the read-out delay according to the invention.

We claim:

1. An n-channel random access memory comprising in a p-type semiconductor substrate:
    a plurality of memory cells arranged in a matrix form, each of the memory cells including an information storing MOSFET having a source connected to a reference potential, word lines being associated with respective rows of the matrix, the word line being adapted to receive a positive voltage signal relative to the reference potential;
    row selecting MOSFET's connected to the word lines respectively; and
    switching means including a plurality of clamping MOSFET's each connected between a respective word line and said reference potential for clamping the word line to a predetermined potential when the word line is not selected, said clamping MOSFET's having a lower threshold voltage than that of the row selecting MOSFET to thereby turn on prior to the row selecting MOSFET in response to a noise signal on the non-selected word line.

2. A p-channel random access memory comprising in an n-type semiconductor substrate:
    a plurality of memory cells arranged in a matrix form, each of the memory cells including an information storing MOSFET having a source connected to a reference potential, word lines being associated with respective rows of the matrix, the word line being adapted to receive a negative voltage signal relative to the reference potential;
    row selecting MOSFET's connected to the word lines respectively; and
    switching means including a plurality of clamping MOSFET's each connected between a respective word line and said reference potential for clamping the word line to a predetermined potential when the word line is not selected, the clamping MOSFET's having a lower threshold voltage than that of the row selecting MOSFET to thereby turn on prior to the row selecting MOSFET in response to a noise signal on the non-selected word line.

* * * * *